(12) United States Patent
Chiu et al.

(10) Patent No.: US 12,610,614 B2
(45) Date of Patent: *Apr. 21, 2026

(54) SEMICONDUCTOR DEVICE AND MANUFACTURE THEREOF

(71) Applicant: TAIWAN SEMICONDUCTOR MANUFACTURING COMPANY, LTD., Hsinchu (TW)

(72) Inventors: Te-Hsin Chiu, Hsinchu (TW); Shih-Wei Peng, Hsinchu (TW); Meng-Hung Shen, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/735,302

(22) Filed: Jun. 6, 2024

(65) Prior Publication Data

US 2024/0332303 A1    Oct. 3, 2024

Related U.S. Application Data

(60) Continuation of application No. 18/313,971, filed on May 8, 2023, now Pat. No. 12,009,364, which is a
(Continued)

(51) Int. Cl.
*H01L 29/76* (2006.01)
*H01L 29/94* (2006.01)
(Continued)

(52) U.S. Cl.
CPC ......... *H10D 84/853* (2025.01); *H10D 30/024* (2025.01); *H10D 30/6211* (2025.01); *H10D 62/115* (2025.01)

(58) Field of Classification Search
CPC ............... H10D 84/853; H10D 30/024; H10D 30/6211; H10D 62/115; H10D 84/83;
(Continued)

(56) References Cited

U.S. PATENT DOCUMENTS 4,612,083 A    9/1986  Yasumoto et al.
10,784,150 B2    9/2020  Su
(Continued)

*Primary Examiner* — Theresa T Doan
(74) *Attorney, Agent, or Firm* — Merchant & Gould P.C.

(57) ABSTRACT

In some embodiments, a method of making a semiconductor device includes forming a recess in a first region of a first dielectric material, the first dielectric material at least partially embedding a semiconductor region, the recess having a first surface portion separated by a distance in a first direction from the semiconductor region by a portion of the first dielectric material; depositing a second dielectric material in the recess to form a second surface portion oriented at an oblique angle from the first surface portion; and depositing a conductive material in the recess. In some embodiments, the method further includes partially exposing the semiconductor region in a second recess in the first dielectric material and selectively depositing the second dielectric material on the first dielectric material, but not the semiconductor region, in the second recess.

10 Claims, 9 Drawing Sheets

Related U.S. Application Data division of application No. 17/232,293, filed on Apr. 16, 2021, now Pat. No. 11,646,314.

(51) Int. Cl.
  *H10D 30/01*     (2025.01)
  *H10D 30/62*     (2025.01)
  *H10D 62/10*     (2025.01)
  *H10D 84/85*     (2025.01)

(58) Field of Classification Search
  CPC .... H10D 84/85; H10D 89/10; H10D 84/0186; H10D 84/0188; H10D 84/0193; H10D 84/0151; H10D 84/0149; H10D 84/0158; H10D 84/038
  USPC .......................................................... 257/314
  See application file for complete search history.

(56)                   References Cited

U.S. PATENT DOCUMENTS

| | | |
|---|---|---|
| 11,289,496 B2 | 3/2022 | Noda |
| 11,646,314 B2 | 5/2023 | Chiu et al. |
| 12,009,364 B2 * | 6/2024 | Chiu ...................... H10D 89/10 |
| 2006/0113522 A1 | 6/2006 | Lee et al. |

* cited by examiner

<u>120</u>

VDD 110a, 114a

PMOS
122

S

D

IN      110d, 112a 110b, 116a      OUT
110F, 116b

D

NMOS
124

S 110g, 114b

VSS

<u>600</u>

700

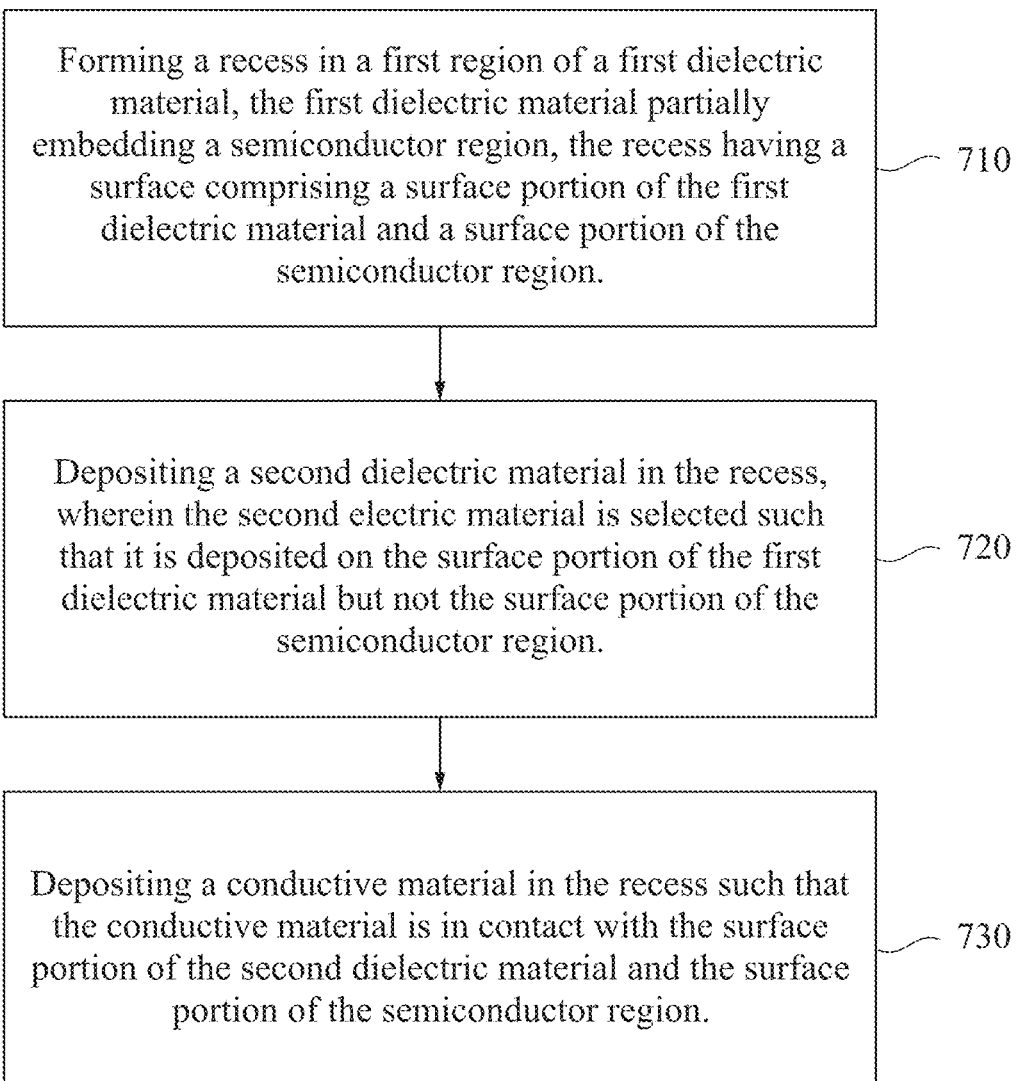

Forming a recess in a first region of a first dielectric material, the first dielectric material partially embedding a semiconductor region, the recess having a surface comprising a surface portion of the first dielectric material and a surface portion of the semiconductor region.

⌐ 710

Depositing a second dielectric material in the recess, wherein the second electric material is selected such that it is deposited on the surface portion of the first dielectric material but not the surface portion of the semiconductor region.

⌐ 720

Depositing a conductive material in the recess such that the conductive material is in contact with the surface portion of the second dielectric material and the surface portion of the semiconductor region.

SEMICONDUCTOR DEVICE AND MANUFACTURE THEREOF

CROSS-REFERENCE TO RELATED APPLICATIONS

This application is a continuation of U.S. patent application Ser. No. 18/313,971, filed on May 8, 2023, now U.S. Pat. No. 12,009,364, which is a divisional of U.S. patent application Ser. No. 17/232,293, filed on Apr. 16, 2021, now U.S. Pat. No. 11,646,314, the disclosures of which are hereby incorporated by reference in their entirety.

BACKGROUND

This disclosure relates generally to semiconductor devices and their manufacture and more specifically to high density integrated circuits (ICs).

Integrated circuits are being designed and manufactured at increasingly high device densities. In order to achieve higher densities of devices (e.g., transistors), dimensional parameters, such as active region spacing, contact pitch, via pitch and metal spacing needs to be decreasing. As such dimensional parameters become smaller, circuit parts designed to be insulated from each other are dispose closer to each other, and the probability of them coming into contact with one another, or coming closer than minimum designed separation, due to variations in the manufacturing process becomes higher. A decrease in yield may result. Efforts in increasing IC device density while avoiding yield drop are ongoing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 outlines a process for manufacturing a semiconductor device in accordance with some embodiments.

DETAILED DESCRIPTION

Figure 1A:
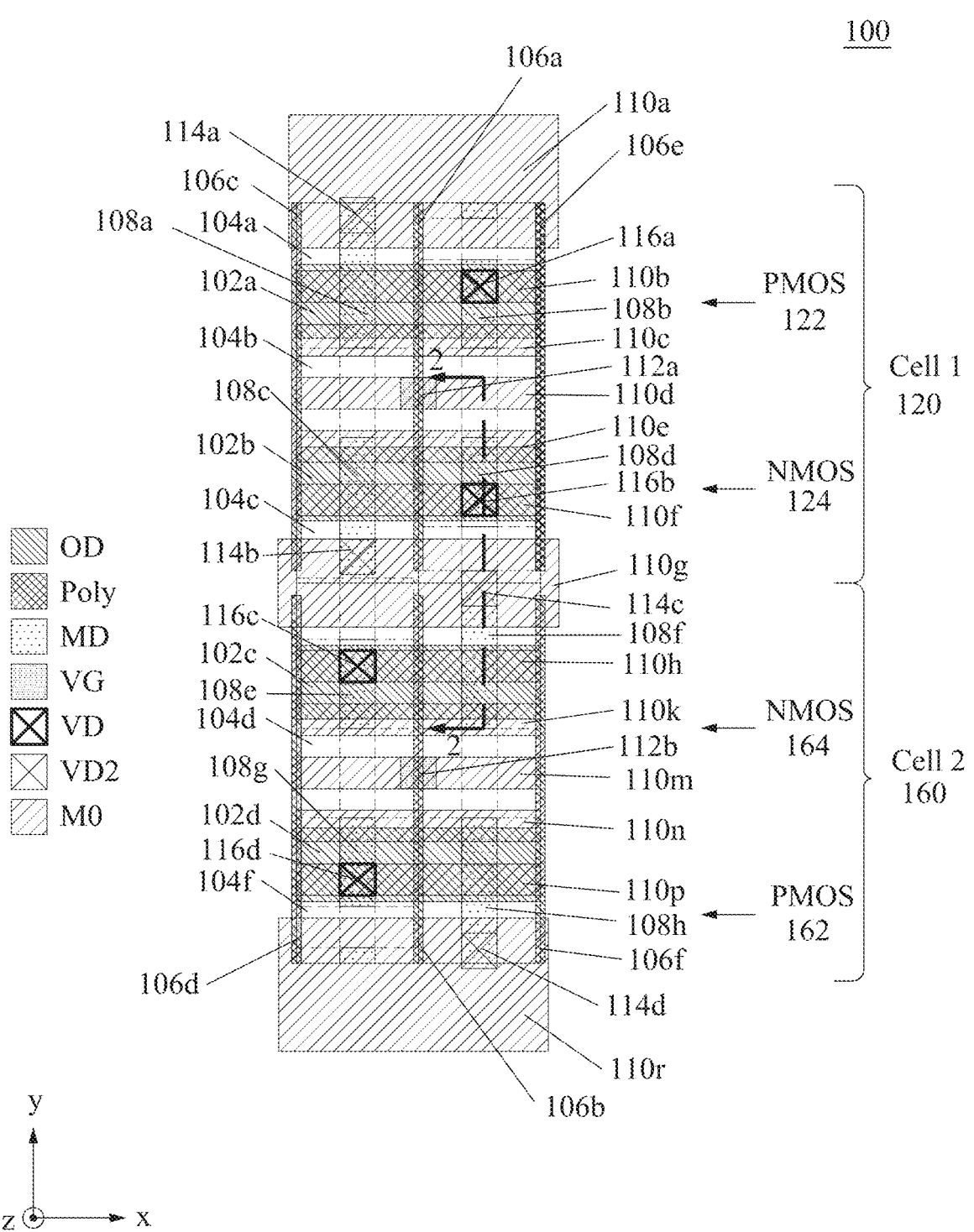
FIG. 1A shows a top view of an example semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs) are being designed and manufactured at increasingly high densities of semiconductor devices, such as transistors. The higher device densities correspond to smaller dimensional parameters, such as active region spacing, contact pitch, via pitch and metal spacing. As such dimensional parameters, such as cell height (CH), become smaller, circuit parts designed to be insulated from each other are dispose closer to each other, and the probability of them coming into contact with one another, or coming closer than minimum designed separation, due to variations in the manufacturing process becomes higher. For example, in certain logic cells composed of fin field-effect transistors (FinFETs), a source or drain region (i.e., active region (OD)) in one transistor may be positioned in close proximity, but designed to be insulated from, a metal-to-device, or device-level, contact (MD) of a drain or source region of an adjacent transistor. In certain designs in which the designed MD-to-OD distance (sometimes referred to as the "bridge window") is small, e.g., on the order of 3 nm or less. In such device, variability of the IC fabrication process, e.g., mask alignment, may result in the MD-to-OD distance to be unacceptably small, or MD touching OD (sometimes referred to as "bridging"), resulting in a device failure and a decrease in yield. Certain semiconductor devices and processes used to fabricate those devices are capable of providing high device density while maintaining acceptable bridge window.

In some embodiments, a semiconductor device includes a first conductive or semiconductive region, a second conductive or semiconductive region, and a dielectric region separating the first and second conductive or semiconductive regions and having a varying thickness. In some embodiments, the first region is an epitaxial source/drain structure of a transistor, and the second region is a portion of a contact layer, with the first and second regions overlapping one another in a first direction (e.g., along the z-axis, the direction normal to the contact layer and to the top surface of the semiconductor die upon which the devices are built) and the distance between the first and second regions in a second direction transverse to the first direction (e.g., along the y-axis) varying along the first direction. In some embodiments, the second region and the dielectric region form a first boundary portion that is oblique (e.g., between about 30° and) 60° to the first direction. In some embodiments, the second region and the dielectric region further form a second boundary that is substantially parallel to the first direction.

In some embodiments, a method for making a semiconductor device includes forming a recess in a first region of a first dielectric material, the first dielectric material at least partially embedding a semiconductor region, the recess having a first surface portion separated a distance in a first direction from the semiconductor region by a portion of the first dielectric material; and depositing a second dielectric material in the recess to form a second surface portion oriented at an oblique angle from the first surface portion.

In some embodiments, a method of making a semiconductor device includes forming a recess in a first region of a first dielectric material, the first dielectric material partially embedding a semiconductor region, the recess having a surface comprising a surface portion of the first dielectric material and a surface portion of the semiconductor region; and depositing a second dielectric material in the recess, wherein the second electric material is selected such that it is deposited on the surface portion of the first dielectric material but not the surface portion of the semiconductor region.

Figure 1B:
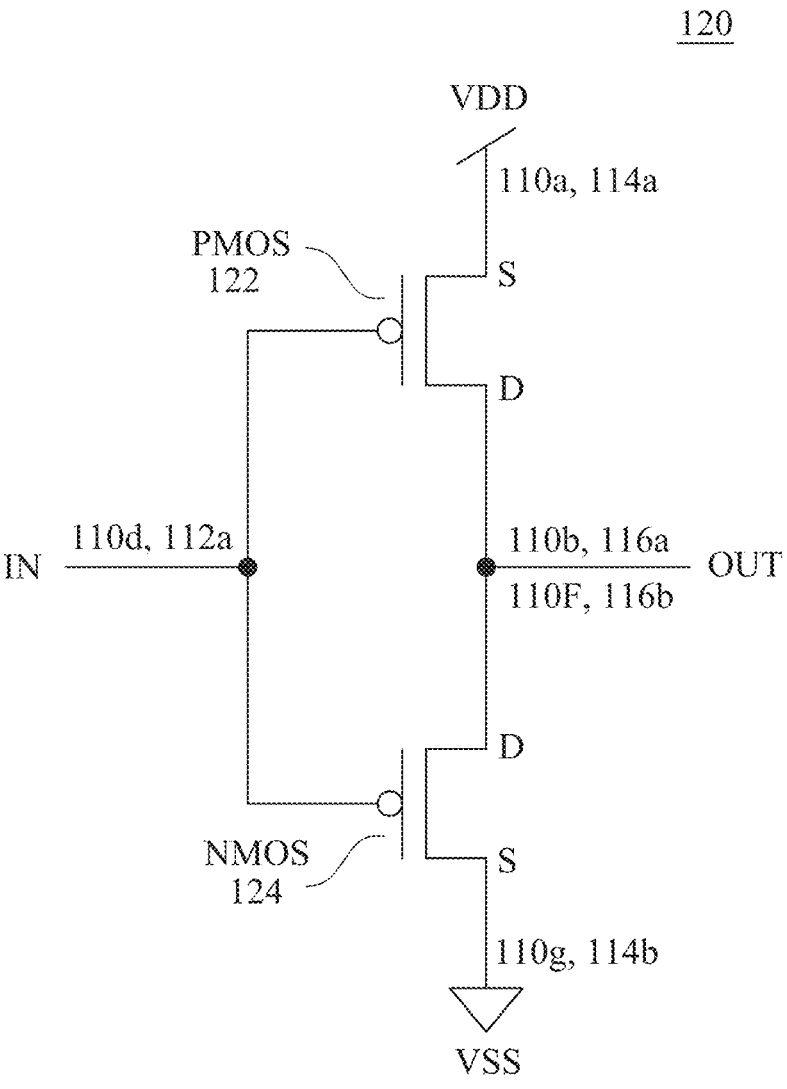
FIG. 1B shows the circuit diagram for the device shown in FIG. 1A in accordance with some embodiments.

In some embodiments, such as the example shown in the top-view layout diagram in FIG. 1A, a semiconductor device 100 is an integrated circuit (IC) device, which in this example includes two logic cells 120, 160, which can be so-called "standard cells" is IC design. Each of logic cells 120, 160 in this example are complementary metal-oxide-semiconductor (CMOS) inverters (INVs), the circuit diagram for one of which 120 is shown in FIG. 1B. Inverter 120 includes a p-channel metal-oxide-semiconductor (MOS) field-effect transistor (FET) (PMOS) 122 constructed in an n-doped region (N-well) and an n-channel MOSFET (NMOS) 124 constructed in a p-doped region (P-well). Similarly, inverter 160 includes a PMOS 162 constructed in an N-well and an NMOS 164 constructed in a P-well.

The semiconductor device 100 in this example is a fin field-effect-transistor (FinFET) device with active regions (ODs) 102a-d, each of which includes one or more parallel semiconductor fins formed upward (along z-axis in FIG. 1A) on a semiconductor substrate (not shown) and running laterally in a first direction (along x-axis in FIG. 1A). The ODs, as well as the semiconductor fins within each OD, are spaced apart from each other in a third direction (along y-axis in FIG. 1A) by regions 104a-f of a dielectric material, such as an oxide or nitride of silicon. Gates 106a-f, made of polycrystalline silicon (poly) in some embodiments, are formed over and around the upper portions of the fins in the ODs with a gate insulation layer (not shown) in between. The OD regions on each side of the gates 106a and 106b are sources/drains, in contact with conductive contacts (source or drain contacts) (MD) 108a-h, which can be any suitable conductive material, including metals. Above the gates 106a-f and source/drain contacts 108a-h is a layer of metal lines or pads (M0) 110a-h, k, m, n, p, r, which serve to interconnect various parts of the IC and connect the various parts of the IC to external connections such as power supply and input/output (I/O). Gate interconnecting contacts, or vias, (VG) 112a, 112b interconnect, respectively, gate 106a with M0 110d, and gate 106b with M0 110m. VG 112a serves as the input contact for the first inverter 120; VG 112b serves as the input contact for the second inverter 160. Source interconnecting contacts, or vias, (VD) 114a-d interconnect, respectively, source contact 108a with M0 110a (which is connectable to a positive voltage supply, VDD (FIG. 1B)), source contact 108c with M0 110g (which is connectable to a negative voltage supply, VSS (FIG. 1B)), source contact 108f with M0 110g, and source contact 108h with M0 110r (which is connectable to a positive voltage supply, VSS). Drain interconnecting contacts, or vias, (VD2) 116a-d interconnect, respectively, drain contacts 108b with M0 110b, drain contact 108d with M0 110f (which is connectable to M0 110b to form the output of the inverter 120 (FIG. 1B)), drain contact 108e with M0 110h, and drain contact 108g with M0 110p (which is connectable to M0 110h to form the output of the inverter 160).

In some embodiments, a conductive or semiconductive structure, such as MD, of one device (e.g., MD 108f of the NMOS 164 for the second inverter 160) is disposed in close proximity, but separated from, a conductive or semiconductive structure, such as a part of a fin, of a neighboring device (e.g., OD 102b of the PMOS 124 for the first inverter 120) by an intervening insulating region. In some embodiments, such as the example illustrated in FIGS. 1A and 1B, at least one of the conducting and semiconducting regions is configured such that the minimum thickness of the intervening insulating region provide adequate insulation between the two regions.

Figure 2:
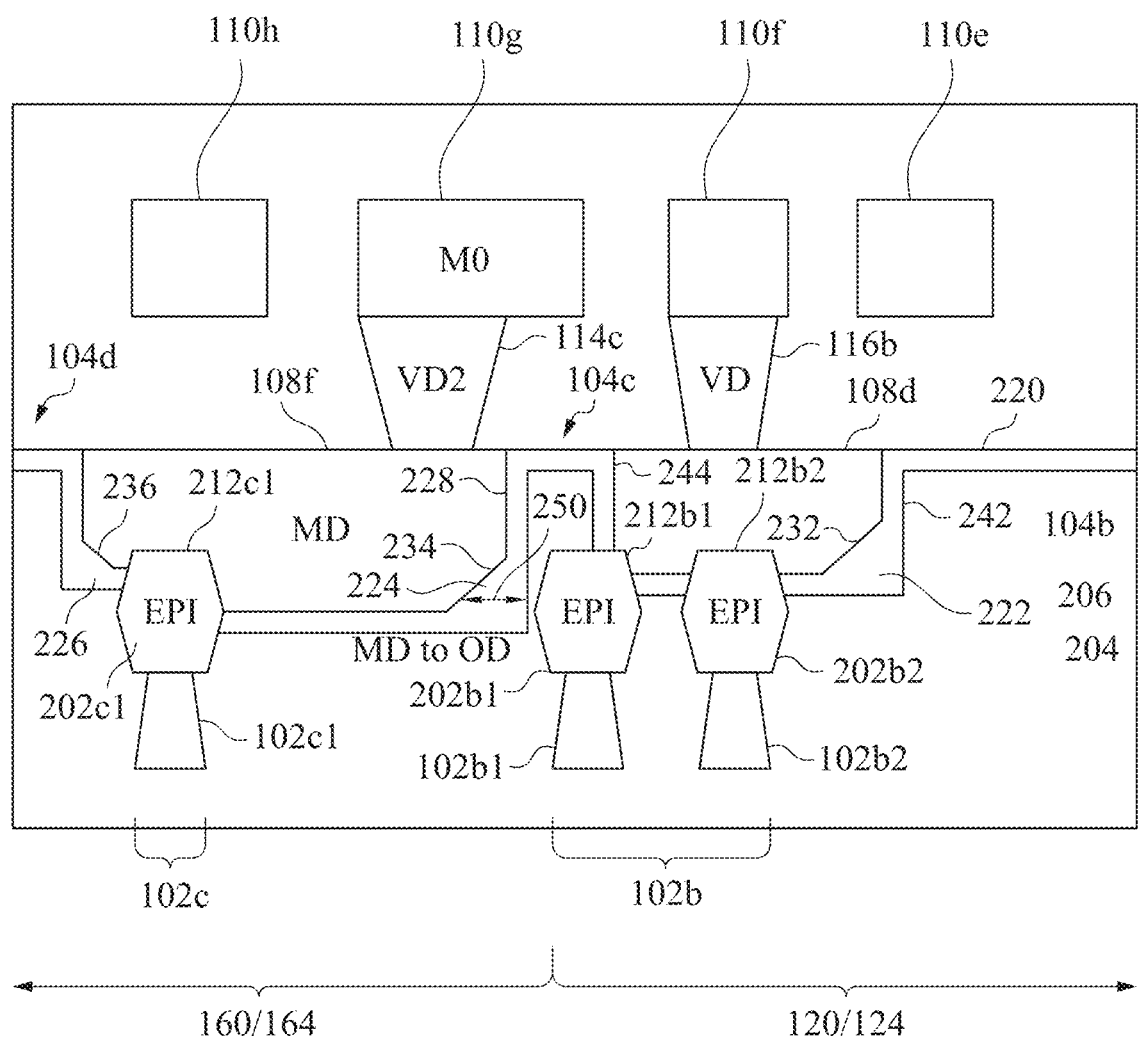
FIG. 2 shows a cross-section of a portion of the device shown in FIG. 1A in accordance with some embodiments.
Figure 2:
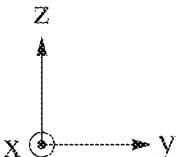

As shown in FIG. 2, which is the cross-section taken at cutline 2-2 in FIG. 1A, OD 102c of the NMOS 164 in the second inverter 160 has a single fin 102c1, the top portion of which is an epitaxially-formed portion (EPI) 202c1. The EPI portion 202c1 in some embodiments is in some embodiments formed of Si, SiGE, SiP, SiC, SiPC, SiAs, or combinations thereof. Various compositions of the EPI region can be a used to create different strains of the region, thereby affecting the mobility of the charge carriers. OD 102b of the NMOS 124 in the first inverter 120 is dual-fin NMOS having a pair of fins 102b1, 102b2, the top portion of which are epitaxially-formed portions (EPIs) 202b1, 202b2, respectively. The EPI portions 202b1, 202b2 in some embodiments are similar to the EPI portion 202c1. The number fins for each OD can vary. For example, each OD can have one, two, or three fins. The ratio between the number of fins in neighboring ODs can also vary. For example, the ratio can be 1:1, 1:2 or 2:3.

The EPI regions 202c1, 202b1, 202b2 are partially embedded in a dielectric region 204, which forms the dielectric regions 104b, 104c, 104e. The dielectric region 104c in this example separates the MD regions 108f, 108d from each other. Such a region is sometimes referred to as a "cut MD" (CMD). The dielectric region 204 in some embodiments includes a first dielectric region 206 and a second dielectric region 220, which in some embodiments over the first dielectric region 204. The second dielectric region 220 in some embodiments is deposited on the first dielectric region 206 after the first dielectric region 206 has been formed. Each dielectric region 206, 220 each can be made of any suitable dielectric material, including a silicon oxide, silicon nitride, silicon oxynitride, fluoride-doped silicate or combinations thereof. Dielectric regions 206, 220 in some embodiments have the same composition but in other embodiments have different compositions from each other.

The MD regions 108d, 108f in some embodiments are formed in respective recesses in the dielectric region 204. The EPI regions 202c1, 202b1, 202b2 penetrate the interfaces between the MD regions 108d, 108f and dielectric region 204, forming EPI-MD interfaces at EPI surfaces 212c1, 212c1, 212c2, respectively.

In some embodiments, the interface between MD regions 108d, 108f and dielectric region 204 is faceted: In addition to interface portions that are parallel to a y-plane or z-plane (i.e., perpendicular to the y-axis or z-axis, respectively), the MD-dielectric interface includes portions 232, 234, 236 that are inclined, or at an oblique angle, relative to y-planes and z-planes. For example, with reference to FIG. 3D, interface portion 234 between MD 108*f* and the dielectric region 204 is oriented at an oblique angle, θ, relative to a y-plane 308*f*2. In some embodiments, θ is in the range of 20°-70°; in some embodiments, θ is in the range of 30°-60°; in some embodiments, θ is in the range of 40°-50°. In some embodiments, the oblique interface portions 232, 234, 236 are formed between the MD regions 108*d*, 108*f* and second dielectric region 220 in respective corner regions 222, 224, 226 of the second dielectric region 220.

In some embodiments, such as shown in FIG. 2, the EPI region 202*b*1 closest to the MD 108*f* insulated from it by the dielectric region 204 overlap each other in at least one direction (in this example along the z-axis) across the dielectric region 204. Because at least a portion of the oblique interface portion 234 lies inside the overlap region, the distance 250 between the MD region 108*f* and the EPI region 202*b*1, measured along a direction (in this example along the y-axis) perpendicular to the direction of overlap from the EPI edge closest to the MD region 108*f*, varies in the direction of the overlap. As a result, local MD-to-OD distance 250 is kept above a minimum that ensures adequate insulation between MD 108*f* and EPI 202*b*1, even though the spacing between two conductive/semiconductive regions in the y-direction (i.e., between the interface portion 228 and the left edge of EPI 202*b*1) can be smaller.

Note that the positioning of the MD regions 108*d*, 108*f* relative to the EPI regions 202*c*1, 202*b*1, 202*b*2 in the y-direction is further to the right than ideal; in an ideal alignment, the MD region 108*d* would be positioned directly above the EPI regions 202*b*1, 202*b*2. However, due to process variability, certain misalignment can occur, and the recesses in which the MD regions 108*d*, 108*f* are formed can be offset from the ideal positions. As a result, EPI 202*b*1 can be closer to MD 108*f* than ideal. The formation of the corner region 224 in the second dielectric layer 220 ensures that the interface 234 between MD 108*f* is separated from EPI 202*b*1 by a sufficient distance to ensure proper insulation within the manufacturing tolerance.

In some embodiments, the second dielectric region is a layer having multiple portions 242, 244 parallel to each other and with different thicknesses. In the example shown in FIG. 2, the portion 244 at the left edge of the MD region 108*d* is thinner than the portion 242 at the right edge. The reduced thickness of the left-side portion 244 expose a large MD-EPI interface area (or EPI landing) 212*b*1, ensuring a more robust contact between MD region 108*d* and EPI region 202*b*1.

Figure 3A:
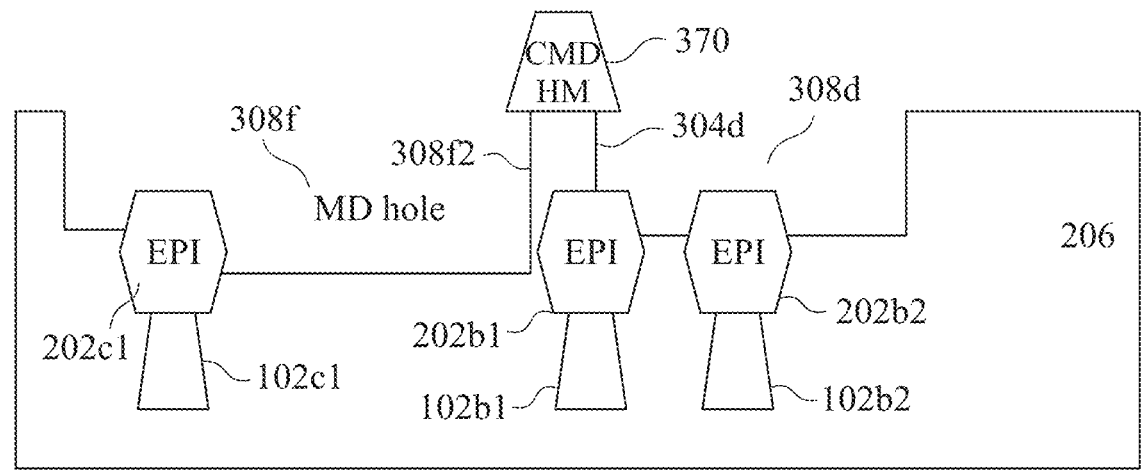
FIGS. 3A-3D show the cross-section of the portion of the device shown in FIGS. 1A and 2 at various stages of manufacture in accordance with some embodiments.
Figure 3A:
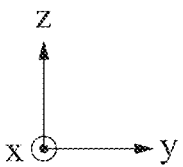

In some embodiments, as illustrated in FIG. 3A, in a process for making a semiconductor device (e.g., device 100 in FIG. 1), recesses 308*f* and 308*d* are formed in a first dielectric region 206. The recesses 308*f* and 308*d* can be formed by any suitable method, including etching, such as ion beam etching, plasma etching and chemical etching. The etching process also partially exposes the EPI regions 202*c*1, 202*b*1, 202*b*2 inside the recesses 308*f* and 308*d*. A dielectric portion 304*d* is protected from etching by the CMD hard mask (HM) 370, which can be any suitable material for protecting the dielectric material in the dielectric region. In some embodiments, the CMD HM is a metal layer, metal oxide layer or metal nitride layer. Other areas of the first dielectric region 206 can be protected by other portions (not shown) of the mask 370.

Figure 3B:
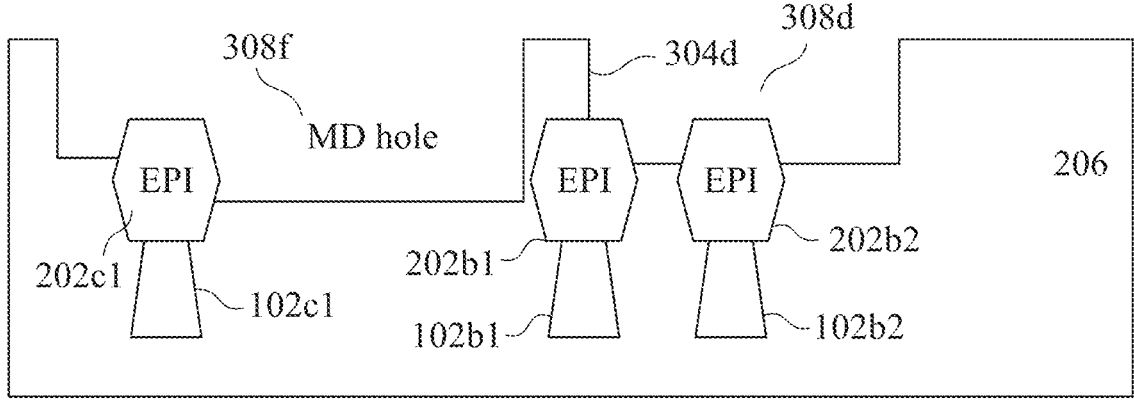
Figure 3B:
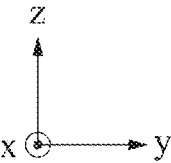

Next, as illustrated in FIG. 3B, the mask is removed after the formation of the recesses 308*f* and 308*d* is complete. The removal can be done by any suitable method. In some embodiments, the removal is done by etching, such as by an acid.

Figure 3C:
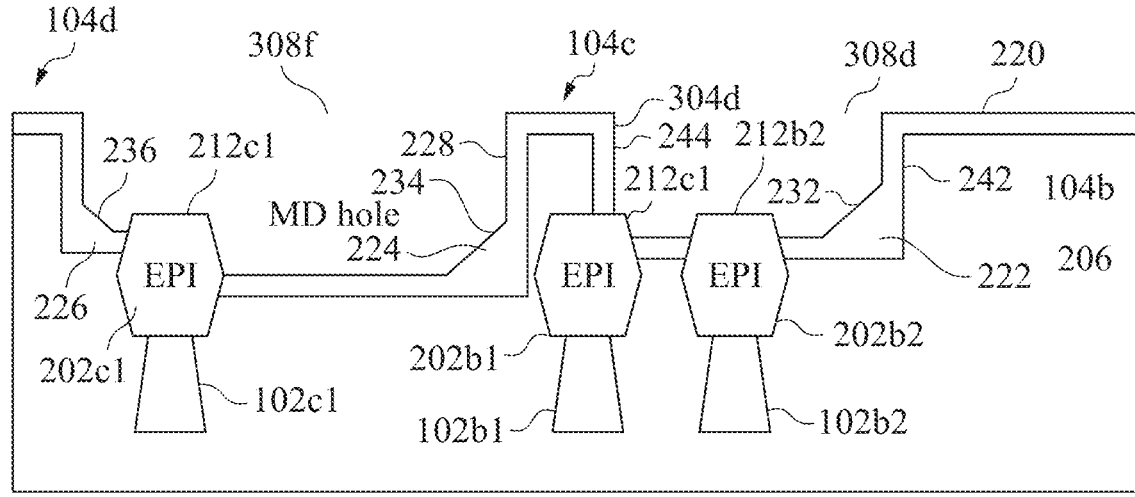
Figure 3C:
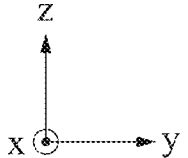

Next, as illustrated in FIG. 3C, a selective deposition is carried out, whereby a second dielectric layer 220 is deposited on the first dielectric region 206 but not on the EPI regions 202*c*1, 202*b*1, 202*b*2. The selectivity in the deposition arises due to the difference in materials between the EPI regions 202*c*1, 202*b*1, 202*b*2 on the one hand and the first dielectric region 206 on the other. The material for the second dielectric region 220 can be the same or different from the material for the first dielectric region 206 but is selected to be compatible, i.e., can bond, with the material for the first dielectric region 206 but incompatible, i.e., does not bond, with the material for the EPI regions 202*c*1, 202*b*1, 202*b*2. For example, for a first dielectric region 206 made of an oxide, such as silicon dioxide, and EPI regions 202*c*1, 202*b*1, 202*b*2 made of silicon germanium, a second dielectric layer 220 of an oxide material, such as silicon dioxide, used for the deposition of the second dielectric region 220 would form on the first dielectric region 206 but not on the EPI regions 202*c*1, 202*b*1, 202*b*2. Any suitable deposition process can be used. In some embodiments chemical vapor deposition (CVD) or physical vapor deposition (PVD) is used.

Figure 3D:
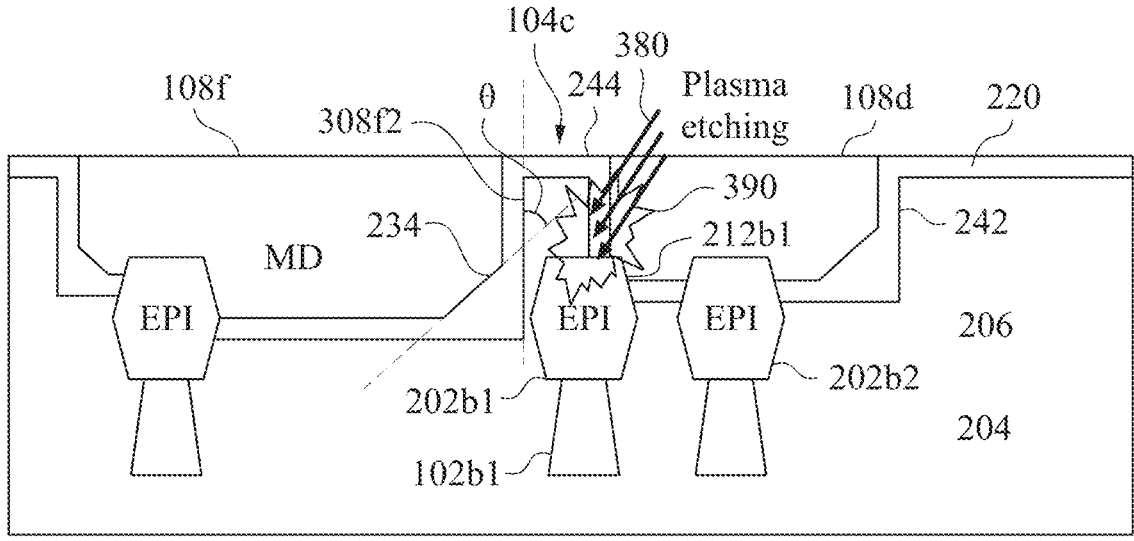
Figure 3D:
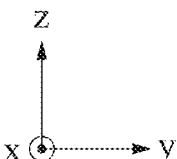

In some embodiments, faceted corners, i.e. oblique surfaces 232, 234, 236 form in corner regions 222, 224, 226 of the second dielectric layer 220. In some embodiments, an etching process is carried out after the second dielectric layer 220 is deposited on the first dielectric region 206. The etching can be, for example, reactive ion etching or plasma etch, in which the etching direction is controlled by the direction of the applied electric field. In some embodiments, where faceted corner regions 222, 224, 226 of the second dielectric layer 220 formed during the selective deposition process, the size and orientation of the oblique surfaces 232, 234, 236 can be changed by the etching. In some embodiments where faceted corner regions 222, 224, 226 of the second dielectric layer 220 have not formed during the selective deposition process, they can be formed during the etching process. Directional etching is also used in some embodiments to preferentially remove certain portions of the dielectric region 204, including the second dielectric layer 220. For example, as illustrated in FIG. 3D, the electrical field 380 applied for plasma etching in some embodiments is directed partially toward a vertical portion 244 of the second dielectric layer 220 to preferentially remove the dielectric material from portion. The preferential removal increases the area of the surface portion 212*b*1 of the EPI region 102*b*1 exposed inside the recess 308*d* in cases where the recess 308*d* is not ideally aligned relative to the EPI regions 202*b*1, 202*b*2.

Next, as illustrated in FIG. 3D, a conductive material, such as one or more metals, is deposited in the recesses 308*d*, 308*f* to form MD regions 108*d*, 108*f*. Any suitable deposition method can be used. In some embodiments, PVD or CVD is used. In some embodiments, MD deposition is carried out in combination (intermittently, for example) with plasma etching process described above to continue to remove dielectric material from certain portions of the dielectric region 204 and deposit the MD material. After the MD deposition, a planarization process is carried out in some embodiments to remove any MD material deposited outside the recesses (including recesses 308*d*, 308*f*) and to make the top surface of the entire device or wafer flat and polished in preparation for the addition of the next layer (such as vias).

Figures 4A, 4B:
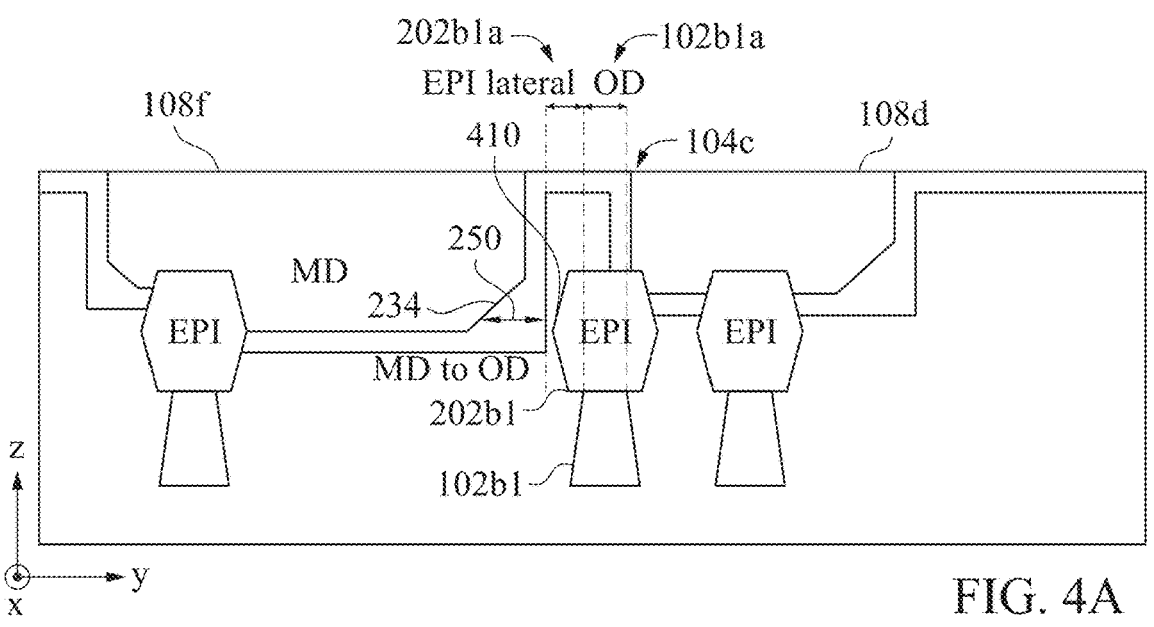
FIG. 4A shows the cross-section of the portion of the semiconductor device shown in FIGS. 1A and 2 at a stage of manufacture after the one shown in FIG. 3D in accordance with some embodiments
FIG. 4B shows the top view of the example semiconductor device shown in FIG. 1A, with a metal-contact-to-source/drain distance shown in FIG. 4A marked in accordance with some embodiments.

In some embodiments, as illustrated in FIGS. 4A and 4B, the process described above results in a device in which the MD-OD spacing provides adequate insulation between MD region 108*f* and neighboring EPI 202*b*1 with the tolerance of misalignment between them. In the example illustrated in FIG. 4A, the EPI region 202*b*1 encroaches into the CMD region 104*c* due to variability in the fabrication process. However, the MD-to-OD spacing is still comparable or greater than the CMD critical dimension (CMD CD), i.e., the width of CMD 104*c*. In some embodiments, such as the one illustrated in FIG. 3A, the CMD CD ranges from 13 to 25 nm. As shown by the example measurement ranges in Table I, the range of MD-to-OD spacing is comparable to greater than the range of CMD CD. (With reference to FIG. 4A, an EPI region 202*b*1 can extend wider than the top of the fin 102*b*1 supporting the EPI region 202*b*1 by an EPI lateral 292*b*1*a* on each side of the fin 102*b*1. The EPI lateral 292*b*1*a* in this example is measured from the edge of the top of the fin 102*b*1 to the farthest lateral (in y-direction) extent (tip 410) of the EPI region 202*b*1. The MD-to-OD spacing 250 is defined in this case as the lateral distance from the tip 410 to the MD 108*f*.)

TABLE I

| Example Measurement Ranges | |
| --- | --- |
| Items | Description |
| CH | Cell Height: 70-240 nm, |
| PP | Poly Pitch: 26-50 nm |
| ODS | OD spacing: 20-70 nm |
| CMD CD | CMD Critical Dimension: 13-25 nm |
| | (CMD pitch~10-25 nm) |
| MD to OD spacing | 13-30 nm |
| EPI lateral | 7-20 nm |

Figure 5:
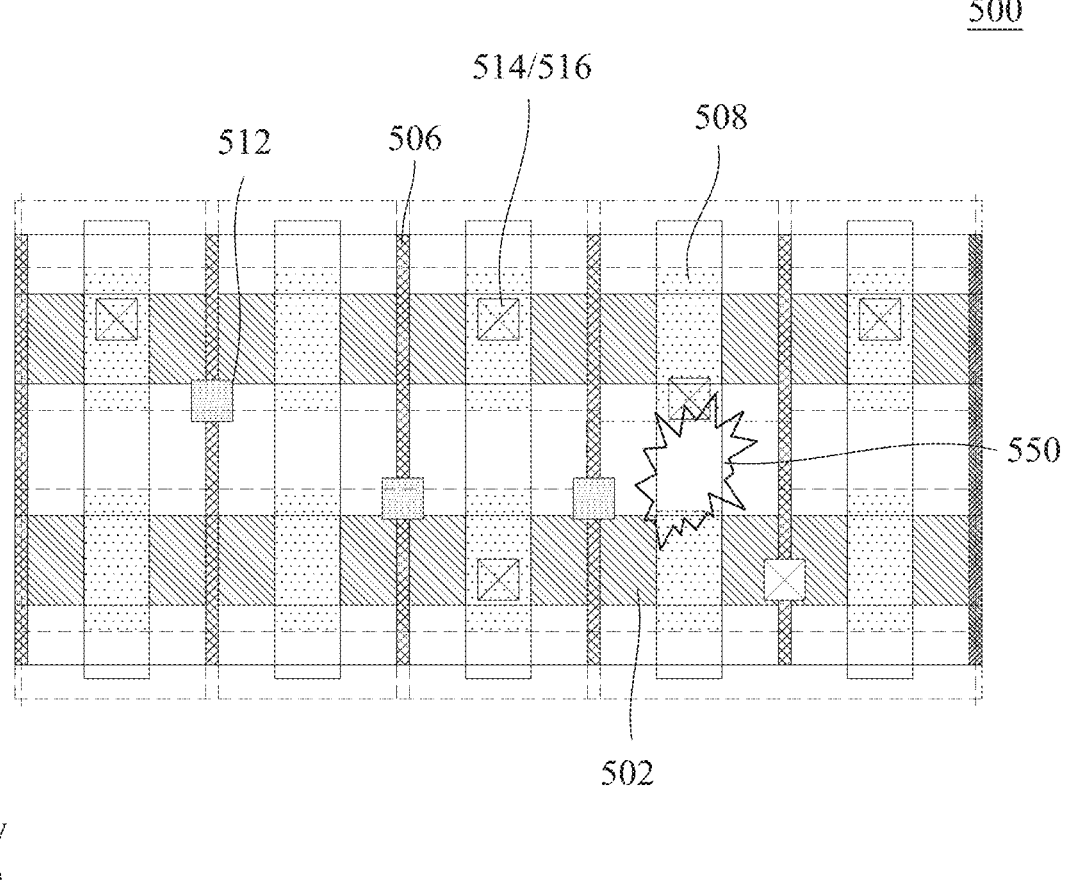
FIG. 5 shows the top view of a portion of a semiconductor device in accordance with some embodiments.

The processes and structures described above are not limited to any specific type of device, but can be applied to any device to adequate separation between two conductive or semiconductive regions. FIG. 5 shows a generic FinFET device 500, which includes ODs 502, gates 506, MDs 508, VGs 512, VDs 514, and VD2*s* 516. If regions such as region 550 exist, where an OD 502 and an MD 508 are close such that variability in the fabrication process my cause bridging between the two, the processes described above can be used to produce the structures disclosed above to reduce that chances for bridging.

Figure 6:
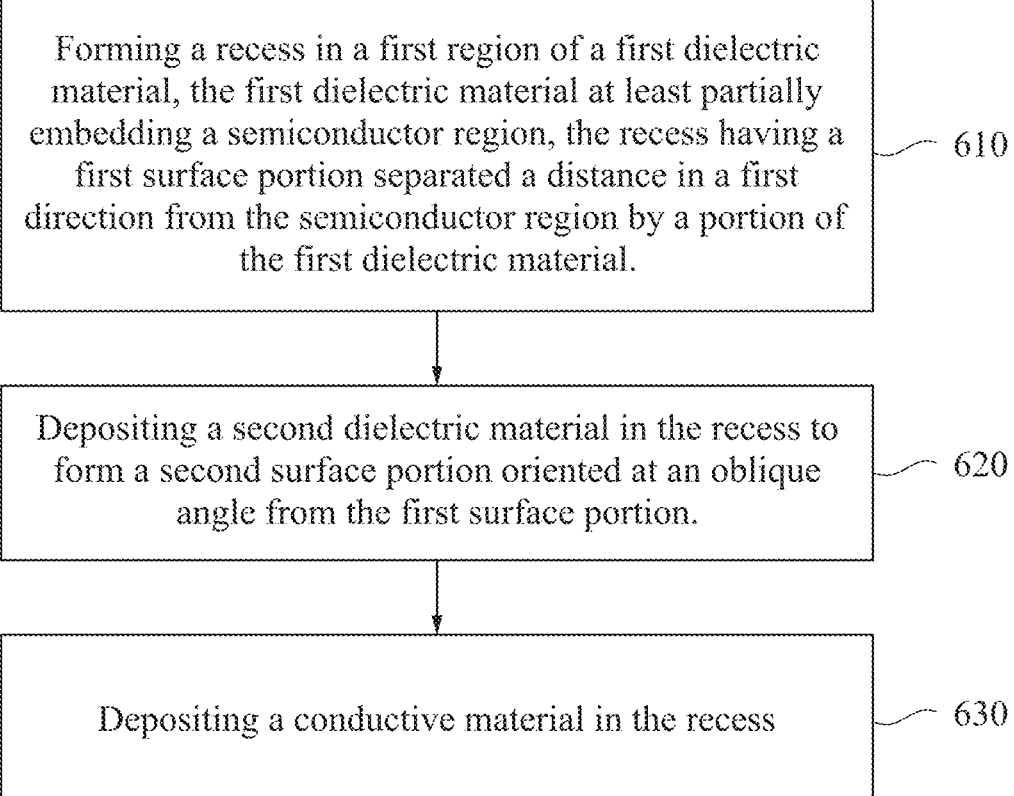
FIG. 6 outlines a process for manufacturing a semiconductor device in accordance with some embodiments.

An aspect of the process described above is outlined in FIG. 6. In some embodiments, a method 600 of making a semiconductor device includes forming 610 a recess in a first region of a first dielectric material, the first dielectric material at least partially embedding a semiconductor region, the recess having a first surface portion separated by a distance in a first direction from the semiconductor region by a portion of the first dielectric material; depositing 620 a second dielectric material in the recess to form a second surface portion oriented at an oblique angle from the first surface portion; and depositing 630 a conductive material in the recess.

Another aspect of the process described above is outlined in FIG. 7. In some embodiments, a method 700 of making a semiconductor device includes forming 710 a recess in a first region of a first dielectric material, the first dielectric material partially embedding a semiconductor region, the recess having a surface comprising a surface portion of the first dielectric material and a surface portion of the semiconductor region; depositing 720 a second dielectric material in the recess, wherein the second electric material is selected such that it is deposited on the surface portion of the first dielectric material but not the surface portion of the semiconductor region; and depositing 730 a conductive material in the recess such that the conductive material is in contact with the surface portion of the second dielectric material and the surface portion of the semiconductor region.

The examples disclosed in this disclosure provide integrated circuit devices with high device density, with reduces device dimensions, such as cell height. The formation of a second dielectric region by selective deposition on a first dielectric region without obscuring any exposed semiconductor region enhances the ability to vary the surface morphology (such as oblique angles of orientations of various surface portions) of the final combined dielectric region. The ability to shape various parts, such as MDs, of the device is thus enhanced, leading to more compact and reliable devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
   forming a dielectric layer substantially oriented in a first direction and partially embedding a semiconductor region;
   forming a first recess in a first region of the dielectric layer;
   forming a second recess in a second region of the dielectric layer and partially exposing the semiconducting region;
   separating the first recess from the semiconductor region in a second direction transvers to the first direction by a portion of the dielectric layer, the portion of the dielectric layer having a first surface portion in the first recess and oriented at an oblique angle from the second direction; and
   depositing a conductive or semiconductive material in the first and second recesses.

2. The method of claim 1, further comprising:
   forming the second recess in a second region of the first dielectric material to expose a portion of the region of semiconductor in the second recess, with the first and second recesses separated from each other by a portion of the first dielectric material; and
   selectively depositing a layer of the second dielectric material on the first dielectric material in the second recess but not on the semiconductor material.

3. The method of claim 2, wherein the selective deposition step comprises depositing as the second dielectric material a material that selectively forms bonding with the first dielectric material but not with the semiconducting material.

4. The method of claim 2, wherein the selectively depositing the layer of the second dielectric material on the first dielectric material in the second recess comprises forming portions of the layer of the second dielectric material of different thicknesses on respective portions of the first dielectric material in the second recess.

5. The method of claim 4, wherein the forming portions of the layer of the second dielectric material of different thicknesses comprises subjecting the different portions of the layer of the second dielectric material to different etching processes.

6. The method of claim 1, wherein:

the forming the first recess comprises forming a bottom surface of the recess, the bottom surface defining a normal direction, the first direction being substantially transverse to the normal direction, the bottom surface and the first surface forming a corner region; and the step of depositing a second dielectric material in the first recess to form a second surface portion oriented at an oblique angle from the first surface portion comprises depositing the second dielectric material in the corner region and forming a second surface of the second dielectric material in the corner region, the second surface being oblique to the first direction and the normal direction.

7. The method of claim 6, wherein the second surface forms an oblique angle with the normal direction of the bottom surface, and the forming the second surface further comprising adjusting the oblique angle.

8. The method of claim 6, further comprising:

forming a second recess in a second region of the first dielectric material to expose a portion of the region of semiconductor in the second recess, with the first and second recesses separated from each other by a portion of the first dielectric material; and selectively depositing a layer of the second dielectric material on the first dielectric material in the second recess but not on the semiconductor material.

9. The method of claim 8, further comprising:

etching the layer of the second dielectric material to increase the portion of the region of semiconductor exposed in the second recess.

10. The method of claim 9, wherein the etching comprises subjecting different portions of the layer of the second dielectric material to different etching processes.

* * * * *